United States Patent
Kamada et al.

[11] Patent Number: 6,157,789
[45] Date of Patent: Dec. 5, 2000

[54] ELECTROPHOTOGRAPHIC APPARATUS

[75] Inventors: Akihiko Kamada; Isao Kato, both of Shiga-ken; Norio Sakai, Moriyama, all of Japan

[73] Assignee: Murata Manufacturing Co., Ltd., Japan

[21] Appl. No.: 09/271,589

[22] Filed: Mar. 18, 1999

[30] Foreign Application Priority Data

Mar. 24, 1998 [JP] Japan .................................. 10-75913

[51] Int. Cl.$^7$ .................................................. G03G 15/00
[52] U.S. Cl. .................. 399/1; 399/46; 399/394
[58] Field of Search .................... 399/46, 66, 297, 399/394, 396, 1

[56] References Cited

U.S. PATENT DOCUMENTS

| | | | |
|---|---|---|---|
| 4,519,700 | 5/1985 | Barker et al. | 399/394 |
| 4,541,711 | 9/1985 | Takahashi | 399/394 |

FOREIGN PATENT DOCUMENTS

| | | |
|---|---|---|
| 9013548 | 1/1991 | Germany . |
| 4114284 | 11/1992 | Germany . |
| 2257696 | 10/1990 | Japan . |

OTHER PUBLICATIONS

German Office Action dated Dec. 15, 1999.
English translation of Dec. 15, 1999 German Office Action.

*Primary Examiner*—Fred L. Braun
*Attorney, Agent, or Firm*—Ostrolenk, Faber, Gerb & Soffen, LLP

[57] ABSTRACT

An electrophotographic apparatus including a photosensitive member; a corona charger for charging a surface of the photosensitive member; a circuit-forming/chargeable powder supplying device for supplying circuit-forming/chargeable powder to a latent image pattern on the photosensitive member; a transferring device for transferring the circuit-forming/chargeable powder on the latent image pattern onto a ceramic green sheet; a flash lamp for fixing the circuit-forming/chargeable powder, transferred onto the ceramic green sheet, in order to form a circuit pattern (not shown) on the ceramic green sheet; and a circuit pattern forming position recognizing camera for detecting a circuit pattern forming position on the ceramic green sheet. In the electrophotographic apparatus, laser beams are used to form a predetermined latent image pattern (not shown) on a surface of the photosensitive member. Even when the electrophotographic apparatus is used for forming a circuit pattern on a print material by an electrophotographic method, the problem that a circuit pattern forming position shifts does not occur.

6 Claims, 3 Drawing Sheets

ELECTROPHOTOGRAPHIC APPARATUS

BACKGROUND OF THE INVENTION

1. Field of the Invention

The present invention broadly relates to an electrophotographic apparatus, and, more particularly, to an electrophotographic apparatus used in forming a circuit pattern on a print material by an electrophotographic method.

2. Description of the Related Art

An electrophotographic apparatus used in forming a predetermined circuit pattern using a method similar to an ordinary electrophotographic method is disclosed in Japanese Unexamined Patent Publication No. 2-257696. In the method, a predetermined circuit pattern is formed on a ceramic green sheet using circuit-forming/chargeable powder by electrostatic forces. FIG. 3 illustrates the structure of a conventional electrophotographic apparatus used in forming a circuit pattern on a ceramic green sheet. The electrophotographic apparatus 50 of FIG. 3 comprises a photosensitive member 51; a corona charger 52 for charging a surface of the photosensitive member 51; a circuit-forming/chargeable powder supplying device 55 for supplying circuit-forming/chargeable powder 54 onto a latent image pattern on the photosensitive member 51; a transferring device 57 for transferring the chargeable powder 54, on the latent pattern on the surface of the photosensitive member 51, onto a ceramic green sheet 56; and a flash lamp 58 for fixing the chargeable powder 54 transferred onto the ceramic green sheet 56 in order to form a circuit pattern (not shown) on the ceramic green sheet 56. The electrophotographic apparatus uses laser beams 53 for forming a predetermined latent image pattern (not shown) on the surface of the photosensitive member 51.

However, in the conventional electrophotographic apparatus, circuit pattern forming positions are determined with reference to an end of a ceramic green sheet. Therefore, when ceramic green sheets get pushed in between the photosensitive member and the transferring device, or when ceramic green sheets get wrinkled or twisted as they pass between the photosensitive member and the transferring device, circuit pattern forming positions get shifted by a few hundred micrometers from the positions of via holes, connected to upper and lower layer circuit patterns. The upper and lower layer circuit patterns are formed when ceramic green sheets are laminated and the resulting laminated structure is baked in order to form a multilayer wiring board. This shifting of position prevents connection between the circuit patterns and the via holes, causing electrical conduction failure, so that a board that does not function as a multilayer wiring board is produced.

SUMMARY OF THE INVENTION

To overcome the above-described problems, preferred embodiments of the present invention provide an electrophotographic apparatus in which circuit pattern position shifting does not occur even when the electrophotographic apparatus is used in forming a circuit pattern on a print material using an electrophotographic method.

One preferred embodiment of the present invention provides an electrophotographic apparatus for forming a circuit pattern on a print material by an electrophotographic method, the electrophotographic apparatus comprising: a photosensitive member; charging means for charging a surface of the photosensitive member; exposing means for forming a predetermined latent image pattern on the surface of the photosensitive member; supplying means for supplying a circuit-forming/chargeable powder to the latent image pattern on the photosensitive member; transferring means for transferring the circuit-forming/chargeable powder on the latent image pattern to the print material; fixing means for fixing the circuit-forming/chargeable powder, transferred onto the print material, in order to provide the circuit pattern on the print material; and detecting means for detecting an X position, a Y position and a θ at which the circuit pattern is to be located on the print material; the detecting means generating a signal to control the X,Y and θ circuit pattern locating position.

According to the embodiment of the present invention, the electrophotographic apparatus is provided with detecting means for detecting the position of a circuit pattern on a print material. The detecting means generates a signal to control the circuit pattern forming position. Therefore, individual circuit patterns can be precisely formed at the positions where they need to be formed.

Therefore, since the position at which a circuit pattern needs to be formed does not get shifted from the design-based position, circuit patterns and via holes can be satisfactorily connected together, making it possible to prevent electrical conduction failures between circuit patterns and via holes. Consequently, the level of defectiveness of multilayer wiring boards is low.

Other features and advantages of the present invention will become apparent from the following description of the invention which refers to the accompanying drawings.

DESCRIPTION OF THE PREFERRED EMBODIMENT

Figure 1:
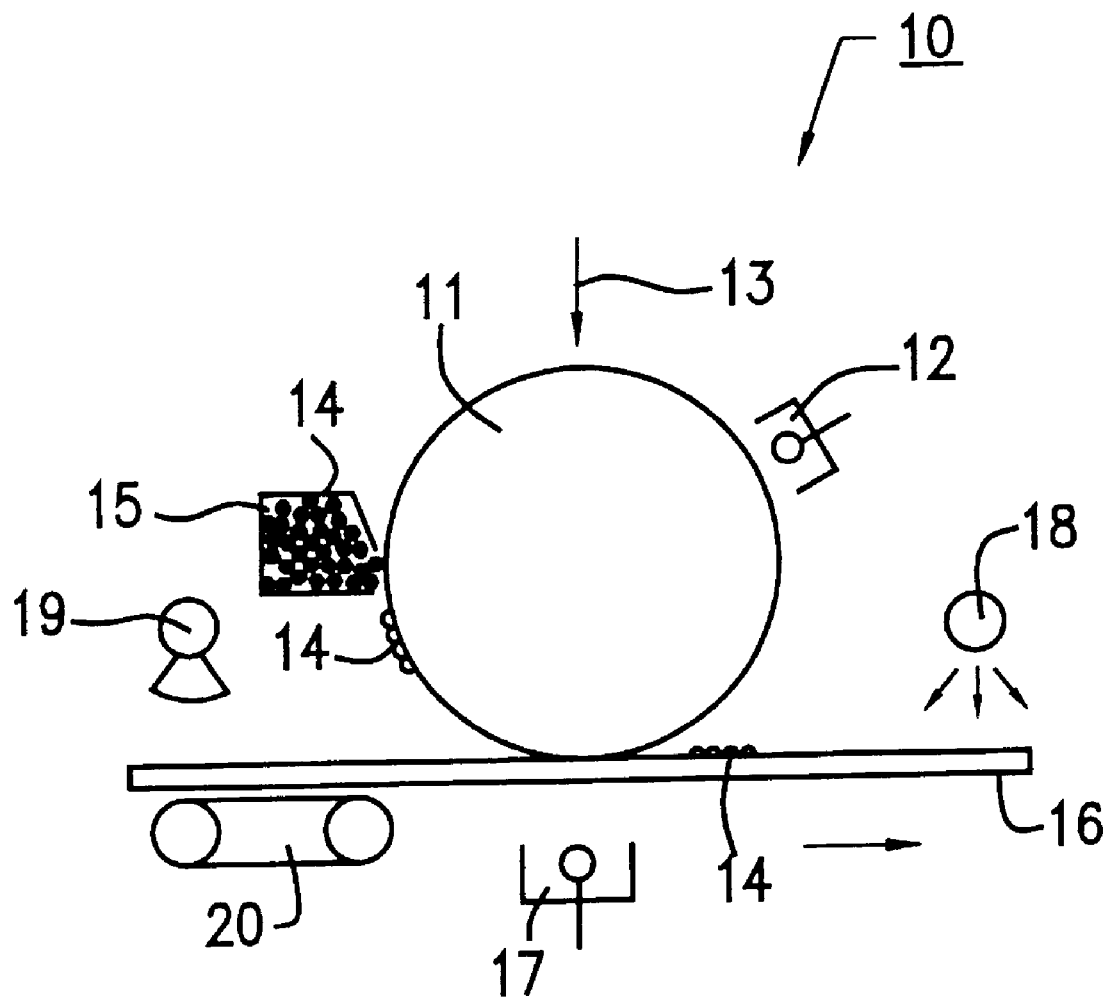
FIG. 1 illustrates the structure of a preferred embodiment of the electrophotographic apparatus in accordance with the present invention.
Figure 2A:
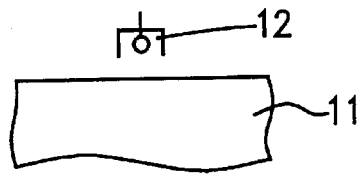
FIGS. 2A to 2E illustrate the steps of forming a circuit pattern onto a print material using the electrophotographic apparatus of FIG. 1.
Figure 2B:
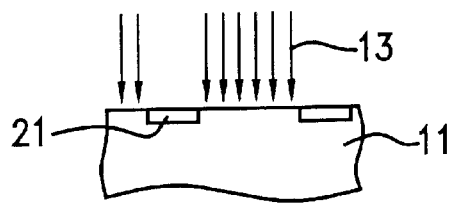
Figure 2C:
Figure 2D:
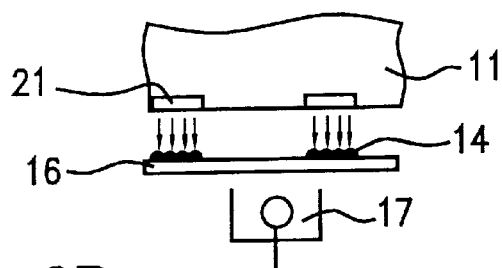
Figure 2E:
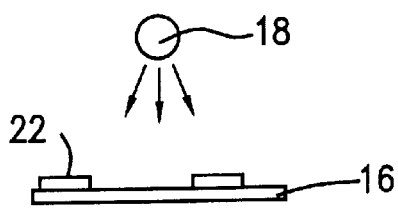
Figure 3:
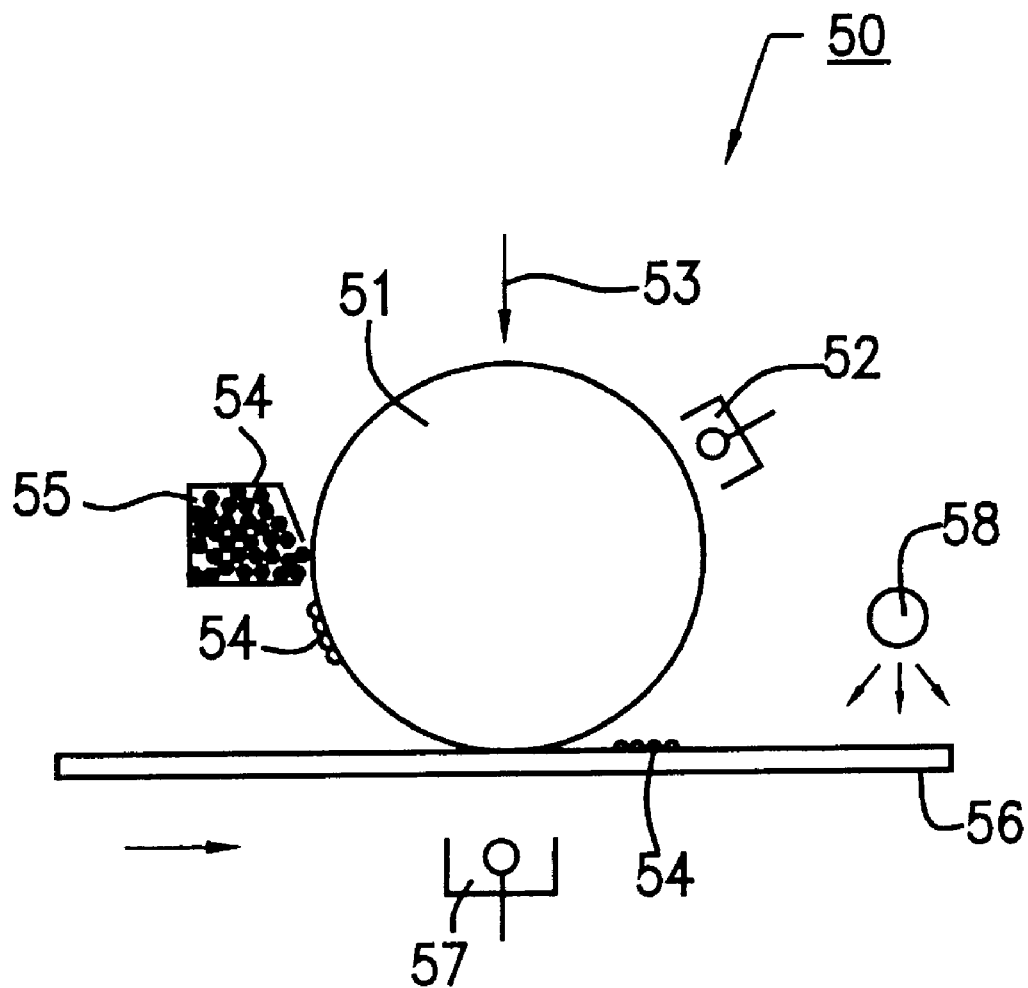
FIG. 3 illustrates the structure of a conventional electrophotographic apparatus.

FIG. 1 illustrates the structure of a preferred embodiment of the electrophotographic apparatus used in forming a circuit pattern on a print material in accordance with the present invention. The electrophotographic apparatus 10 comprises a photosensitive member 11; a corona charger 12; a circuit-forming/chargeable powder supplying device 15; a transferring device 17; a flash lamp 18; and a circuit pattern forming position recognizing camera 19. The corona charger 12, serving as charging means, is used for charging the surface of the photosensitive member 11. The chargeable powder supplying device 15, serving as supplying means, is used for supplying chargeable powder 14 to a latent pattern on the photosensitive member 11. The transferring device 17, serving as transferring means, is used for transferring the circuit-forming/chargeable powder 14 onto a strip of ceramic green sheet 16 to be printed. The flash lamp 18, serving as fixing means, is used to fix the chargeable powder 14 onto the ceramic green sheet 16 in order to form a circuit pattern (not shown) on the ceramic green sheet 16. The circuit pattern forming position recognizing camera 19, serving as detecting means, is used to detect a circuit pattern forming position on the ceramic green sheet 16. The electrophotographic apparatus uses laser beams 13, serving as exposing means, to form a predetermined latent image pattern on a surface of the photosensitive member 11.

In the apparatus 10, when a circuit pattern has been transferred onto the ceramic green sheet 16 by the transferring device 17, the ceramic green sheet 16 is conveyed to the flash lamp 18 by a conveyor belt 20, serving as conveying means, in order to fix the circuit pattern on the ceramic green sheet 16.

When the electrophotographic apparatus 10 having the above-described structure is used, the circuit pattern forming position recognizing camera 19 is used to detect sensing markers which are formed on the ceramic green sheets 16 in the pre-processing step or via holes which connect upper and lower layer circuit patterns, in order to accurately calculate the positions of the circuit patterns from the positions of the sensing markers and the via holes at ceramic green sheets 16. The ceramic green sheets 16 are laminated and baked to form a multilayer wiring board.

If there is a shift in any of the circuit pattern forming positions, the X position, Y position, and θ of the conveyor belt 20 on which the ceramic sheets 16 are placed are corrected in order to accurately adjust the circuit pattern forming position. Therefore, the problem that a circuit pattern forming position gets shifted does not occur.

FIGS. 2A to 2E illustrate the steps of forming a circuit pattern on a ceramic green sheet using the electrophotographic apparatus 10 of FIG. 1. The method of forming a circuit pattern onto a ceramic green sheet comprises a charging step shown in FIG. 2A; an exposing step shown in FIG. 2B; a developing step shown in FIG. 2C; a transferring step shown in FIG. 2D; and a fixing step shown in FIG. 2E. In the charging step, a surface of the photosensitive member 11 is charged by the corona charger 12. In the exposing step, the surface of the photosensitive member 11 is irradiated with the laser beam 13 in order to form the predetermined latent image pattern 21 thereon. In the developing step, the chargeable powder 14 is adhered to the latent image pattern 21 on the surface of the photosensitive member 11 by electrostatic force. In the transferring step, the ceramic green sheet 16 is given an electrical charge opposite to that of the chargeable powder 14 from its back surface by the transferring device 17 in order to transfer the chargeable powder 14 used to develop the latent image pattern 21 onto the ceramic green sheet 16. In the fixing step, the chargeable powder 14, transferred onto the ceramic green sheet 16, is fixed by irradiation using the flash lamp 18 in order to form the circuit pattern 22 on the ceramic green sheet 16.

According to the above-described embodiment, the electrophotographic apparatus is provided with a detecting means for detecting a circuit pattern forming position on a ceramic green sheet. The detecting means generates a signal in order to control the circuit pattern forming position. Therefore, the individual circuit patterns can be precisely formed at the positions where they need to be formed, so that the positions where the circuit patterns need to be formed do not get shifted from the design-based positions. This allows the circuit patterns and the via holes to be satisfactorily connected together, thereby preventing electrical conduction failure between the circuit patterns and the via holes. Consequently, the level of defectiveness of multilayer wiring boards is low.

Since the detecting means is a circuit pattern forming position recognizing camera, a circuit pattern forming position can be detected without contacting the ceramic green sheet. Therefore, it is possible to prevent the ceramic green sheets from getting scratched or from becoming dirty, so that the level of defectiveness of multilayer wiring boards is low.

In the above-described embodiment, when a circuit pattern forming position gets shifted, the position of a ceramic green sheet to be printed is adjusted. However, instead of adjusting the position of the ceramic green sheet, the position of the photosensitive member, on which a latent image pattern which eventually becomes a circuit pattern is formed, may be adjusted when the circuit pattern forming position gets shifted.

Although printing was performed on a ceramic green sheet, it may be performed on a baked ceramic board, such as an alumina board, in order to produce similar effects. In this case, all that needs to be done is to detect via holes for connecting circuit patterns formed on the front and back surfaces of ceramic boards, or sensing markers.

Although strips of ceramic green sheets were used, ceramic green sheet rolls may be used to produce similar effects.

While the invention has been particularly shown and described with reference to preferred embodiments thereof, it will be understood by those skilled in the art that the forgoing and other changes in form and details may be made therein without departing from the spirit of the invention.

What is claimed is:

1. An electrophotographic apparatus for forming a circuit pattern on a print material by an electrophotographic method, the electrophotographic apparatus comprising:

a photosensitive member;

charging means for charging a surface of the photosensitive member;

exposing means for forming a predetermined latent image pattern on the surface of the photosensitive member;

supplying means for supplying a chargeable powder to the latent image pattern on the photosensitive member;

transferring means for transferring the chargeable powder on the latent image pattern to the print material;

fixing means for fixing the chargeable powder, transferred onto the print material, in order to provide the circuit pattern on the print material; and detecting means for detecting an X position, a Y position and a θ at which the circuit pattern is to be located on the print material;

the detecting means generating a signal to control the X, Y and θ circuit pattern location positions.

2. The apparatus of claim 1, further comprising a conveyor for supporting the print material, wherein said signal controls movement of said conveyor to thereby control the position at which the circuit pattern is located on the print material.

3. The apparatus of claim 1, wherein said photosensitive member has a position which is adjustable in response to said signal to thereby control the position at which the circuit pattern is located on the print material.

4. An electrophotographic apparatus for forming a circuit pattern on a print material by an electrophotographic method, the electrophotographic apparatus comprising:

a photosensitive member;

a charger arranged for charging a surface of the photosensitive member;

a laser arranged for forming a predetermined latent image pattern on the surface of the photosensitive member;

a powder supplying device arranged for supplying a chargeable powder to the latent image pattern on the surface of the photosensitive member;

a transferring device arranged for transferring the chargeable powder on the latent image pattern to the print material;

a flash lamp arranged to fix the chargeable powder, transferred onto the print material, in order to provide the circuit pattern on the print material; and a camera arranged for detecting an X position, a Y position and a θ at which the circuit pattern is to be located on the print material;

wherein the camera generates a signal to control the X, Y and θ circuit pattern location positions.

5. The apparatus of claim 4, further comprising a conveyor for supporting the print material, wherein said signal controls movement of said conveyor to thereby control the position at which the circuit pattern is located on the print material.

6. The apparatus of claim 4, wherein said photosensitive member has a position which is adjustable in response to said signal to thereby control the position at which the circuit pattern is located on the print material.

* * * * *